United States Patent [19]

Kurihara et al.

[11] 4,403,150
[45] Sep. 6, 1983

[54] SEMICONDUCTOR RADIATION SENSOR ARRANGEMENT FOR AN AUTOMATIC X-RAY EXPOSURE CONTROL APPARATUS

[75] Inventors: Tetsuro Kurihara; Kosaku Nishio, both of Otawara, Japan

[73] Assignee: Tokyo Shibaura Denki Kabushiki Kaisha, Kawasaki, Japan

[21] Appl. No.: 236,133

[22] Filed: Feb. 18, 1981

[30] Foreign Application Priority Data

Feb. 27, 1980 [JP] Japan .................................. 55-23706

[51] Int. Cl.³ .............................................. G01T 1/24
[52] U.S. Cl. .................................... 250/370; 378/154
[58] Field of Search ................ 250/370, 371; 378/108, 378/159, 186, 154

[56] References Cited

U.S. PATENT DOCUMENTS

| | | | |
|---|---|---|---|
| 2,747,104 | 5/1956 | Jacobs . | |
| 2,824,970 | 2/1958 | Ledin .................... | 378/154 |
| 3,255,351 | 6/1966 | Walsh et al. .......... | 250/370 |
| 4,039,841 | 8/1977 | Leighley ............... | 378/154 |
| 4,082,957 | 4/1978 | Morlan ................. | 378/159 |
| 4,210,805 | 7/1980 | Kobayashi et al. ... | 250/370 |
| 4,288,264 | 9/1981 | Haque .................. | 156/67 |

FOREIGN PATENT DOCUMENTS 55-74480 6/1980 Japan .................................. 250/370

OTHER PUBLICATIONS

H. Yamamoto et al.; "Large Area Mosaic Solid-State Detectors for Low Yield Fission Study", vol. 134, No. 1, Nuclear Instruments and Methods, (North-Holland Publishing Company, Apr. 1976), pp. 119-124.

R. C. Trammell; "Semiconductor Detector Fabrication Techniques", vol. NS-25, No. 2 of IEEE Transactions on Nuclear Science, (Apr. 1978), pp. 910-915.

P. A. Schlosser et al.; "A Practical Gama-Ray Camera System Using High-Purity Germanium", vol. NS-21, No. 1 of IEEE Transactions on Nuclear Science, (Feb. 1974), pp. 658-664.

Primary Examiner—Eugene La Roche
Assistant Examiner—Carolyn E. Fields
Attorney, Agent, or Firm—Finnegan, Henderson, Farabow, Garrett & Dunner

[57] ABSTRACT

A semiconductor radiation sensor arrangement for an automatic X-ray exposure control apparatus disposed in front of an X-ray film to be exposed to X-rays. A semiconductor radiation sensor is set in a mount. The mount is bored with a tapering penetrating hole and securely engaged with a hole penetrating a substrate. The peripheral walls of the mount and that of the penetrating hole of the substrate are tapered in cross section in the similar form. The semiconductor radiation sensor is fixed in the penetrating hole of the mount and has a sufficiently small thickness to cause X-rays to be attenuated to a less extent than 800 microns of aluminum equivalent thickness. Leads are formed of an aluminum layer with a smaller thickness than 80 microns and connected to the electrodes of the semiconductor radiation sensor. At least one scattered X-ray eliminating grid is disposed in parallel with the substrate and the semiconductor radiation sensor.

9 Claims, 4 Drawing Figures

SEMICONDUCTOR RADIATION SENSOR ARRANGEMENT FOR AN AUTOMATIC X-RAY EXPOSURE CONTROL APPARATUS

This invention relates to a semiconductor radiation sensor arrangement for an automatic X-ray exposure control apparatus provided in front of an X-ray film to be exposed to X-rays.

An X-ray diagnostic equipment for projecting X-rays passing through an object on an X-ray film includes an X-ray irradiation control device for controlling X-ray energy and an X-ray dosage to an optimum level for radiography (X-ray photography). Radiography conditions required for the X-ray diagnostic equipment are determined by an anode voltage of an X-ray tube, a magnitude of current of the X-ray tube and a period of time for X-ray irradiation. The conditions may be primarily determined in accordance with a portion of an object to be examined and the extent to which X-rays are absorbed in the portion. However, it is difficult to predetermine an amount of X-rays supposedly absorbed in a particular portion of an object, each time X-ray photography is carried out. Therefore, the radiography conditions are usually determined in accordance with the thickness of a particular portion of an object to be examined, on the assumption that the thickness of the portion and an amount of X-rays absorbed therein have a certain relationship. However, the relationship varies with the position of a portion of an object to be examined. Moreover, an amount of X-rays absorbed even in the same portion changes from one object to another, if the object is a human body. For this reason an automatic X-ray exposure control apparatus has been developed to provide an X-ray photograph with a proper exposure with respect to any portion of an object.

This automatic X-ray exposure control apparatus comprises a radiation sensor for converting an emitted X-ray dosage into an electric signal, and an X-ray controller for adjusting the operation of an X-ray generating unit in accordance with the converted electric signal. The above-mentioned type of automatic X-ray exposure control apparatus is disclosed in the U.S. Pat. No. 4,121,104, for example, in which a radiation sensor is set between an object and X-ray film and an X-ray controller stops the supply of voltage to an X-ray tube when an X-ray dosage detected by the sensor reaches an optimum level to provide the X-ray film with proper exposure. It is also known that a radiation sensor is disposed behind an X-ray film to detect X-rays penetrating an object and the X-ray film, as disclosed in U.S. Pat. No. 4,053,774. In the latter case, considerable amounts of X-rays are absorbed while passing through the object and the X-ray film, making it necessary to apply a highly sensitive radiation sensor or a high gain amplifier and consequently involving great inconvenience. Therefore, it is desirable to set the radiation sensor in front of the X-ray film. In this case, however, care should be taken to prevent the shadow of the sensor itself from being impressed on an X-ray film.

The U.S. Pat. No. 4,095,109 discloses a radiation sensor which is set in front of an X-ray film and prevents the shadow of the radiation sensor from being formed on the X-ray film. According to this disclosure, a graphite layer and electrode layer are formed of a vacuum-deposited electrically conductive material having a low atomic number. Both end portions of the graphite layer and electrode layer have a tapered cross section. It further indicates that several measuring fields can be provided by forming a plurality of electrode layers.

With the radiation sensor disclosed in the U.S. Pat. No. 4,095,109, an X-ray dosage is measured by ionizing current resulting from X-rays entering an ionization chamber which is defined between two electrode plates. However, this arrangement unavoidably renders the X-ray sensor thick. Therefore, the radiation sensor of this type has the drawback that an X-ray film is considerably spaced from an object, resulting in an unnecessary increase in the geometrical magnification rate of X-rays.

Other radiation sensors for the exposure control apparatus include a sodium iodine (NaI) scintillator, and a photomultiplier, respectively.

Reference is now made to the West German Offenlegungsschrift No. 2,806,858, assigned to the same assignee as of the present application, which discloses a semiconductor radiation sensor using a silicon single crystal containing an N type impurity at a lower concentration than $1 \times 10^{14} \text{cm}^{-3}$. This semiconductor radiation sensor has the advantage that it is compact and thin, and consequently has a light weight. Such a thin semiconductor radiation sensor may be applied to an automatic X-ray exposure control in order to reduce the geometrical magnification rate of X-rays. In general X-ray photography, however, a radiation sensor and a scattered X-ray eliminating grid are provided between an object and X-ray film. For practical purposes, therefore, it is ultimately necessary to reduce the total thickness of the radiation sensor and the X-ray eliminating grid.

It is accordingly the object of this invention to provide semiconductor radiation sensor arrangement for an automatic X-ray exposure control apparatus which is provided in front of an X-ray film to be exposed to X-rays, and can reduce the rate of X-ray geometrical magnification as much as possible, thereby producing a finely resolved image of an object on an X-ray film.

To attain the above-mentioned object, this invention provides semiconductor radiation sensor arrangement for an automatic X-ray exposure control apparatus which comprises:

a substrate;

a mount bored with a tapering penetrating hole and securely engaged with a hole penetrating the substrate, the peripheral walls of the mount and that of the penetrating hole of the substrate being tapered in cross section in the similar form;

a semiconductor radiation sensor which is fixed in the penetrating hole of the mount and has a sufficiently small thickness to cause the X-rays to be attenuated to a smaller extent than 800 microns of aluminum equivalent thickness;

leads which are formed of an aluminum layer with a smaller thickness than 80 microns and connected to the electrodes of the semiconductor radiation sensor; and at least one scattered X-ray eliminating grid disposed in parallel with the substrate and the semiconductor radiation sensor.

With the semiconductor radiation sensor arrangement of this invention constructed as described above, a distance between an object and an X-ray film can be reduced at the time of radiographing. Therefore, it is possible not only to reduce the rate of X-ray geometrical magnification, but also to prevent the shadow of a semiconductor radiation sensor from being impressed on an X-ray film, thereby ensuring a distinct X-ray photograph with improved quality. A further technical advantage of this invention, among others, is that an integral assembly of the scattered X-ray eliminating grid and semiconductor radiation sensors offers easy handling.

Other features and advantages of the invention will be apparent from the following description taken in connection with the accompanying drawings, in which.

Figure 1:
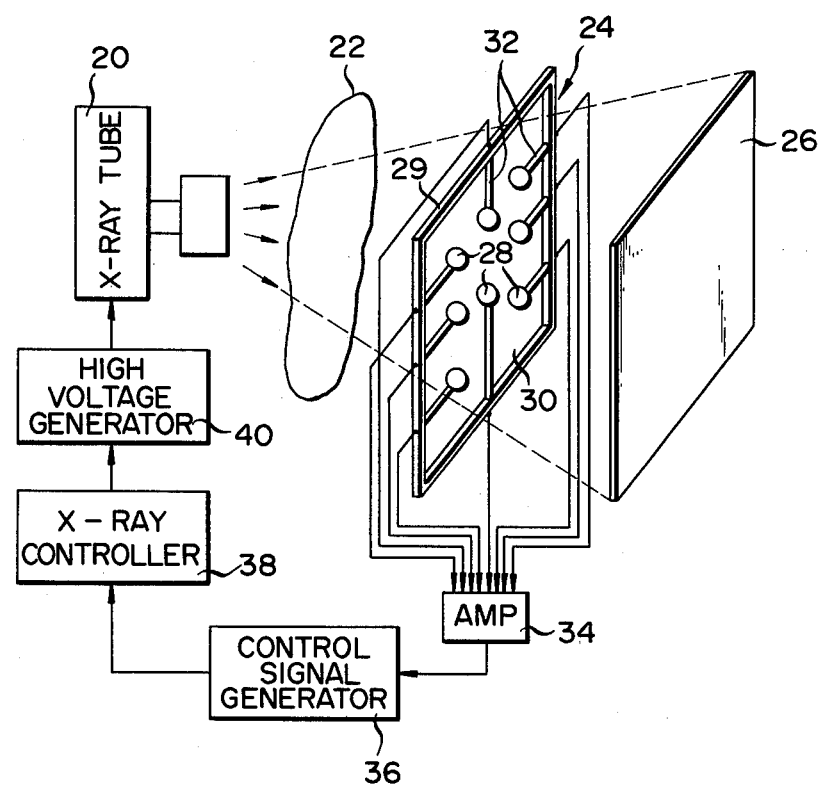
FIG. 1 is a schematic block circuit diagram of an automatic X-ray exposure control apparatus provided with a semiconductor radiation sensor arrangement according to one embodiment of this invention.

X-rays emitted from an X-ray tube 20 pass through an object 22, are detected by an X-ray detecting apparatus 24, and impinge on a direct radiography film 26 (hereinafter simply referred to as "an X-ray film") to form a radiographic image of an object thereon. The X-ray film 26 is received in a cassette together with an X-ray intensifying screen. The cassette is supported by a cassette holder. (Neither X-ray intensifying screen nor cassette is indicated.)

The X-ray detecting apparatus 24 includes a plurality of ring-shaped semiconductor radiation sensors 28 fixed in holes penetrating mounts, respectively.

The mounts are, respectively, securely engaged with holes penetrating a substrate 30 which is rigidly supported at the marginal portions by a frame 29. The X-ray detecting apparatus 24 detects an X-ray dosage to convert it into an electric signal which in turn is coupled through leads 32 to an amplifier 34. The electric signal is amplified by the amplifier 34, and thereafter supplied to a control signal generator 36. The control signal generator 36 includes an integrator which integrates the output signal of the amplifier 34 with respect to time and a comparator which compares the output of the integrator with a reference signal indicative of an optimum X-ray exposure condition, and provides an X-ray controller 38 with an X-ray shutting signal when the output level of the integrator reaches that of the reference signal. The optimum X-ray exposure condition is determined to properly impress a radiographic image of an object 22 on the X-ray film 26. In response to the X-ray shutting signal, the X-ray controller 38 stops voltage supply to a high voltage generator 40.

A plurality of semiconductor radiation sensors 28 may be disposed on any required measuring fields in the positions substantially corresponding to, for example, the breast, head, backbone and abdomen of the human body of which an X-ray photograph (radiograph) is taken.

Figure 2:
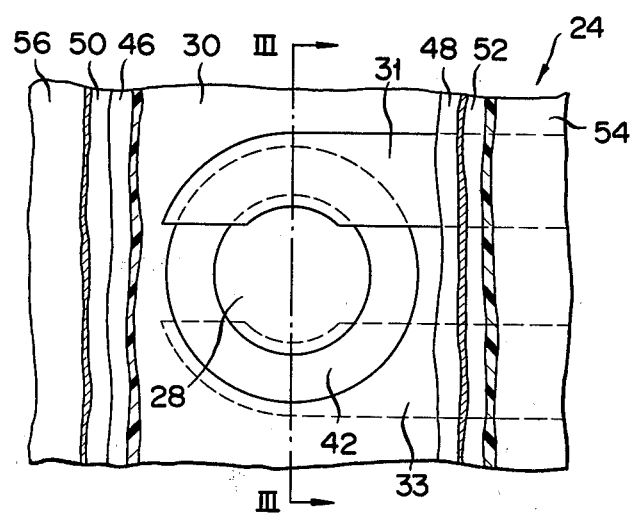
FIG. 2 is a plan view of the semiconductor radiation sensor of the invention.
Figure 3:
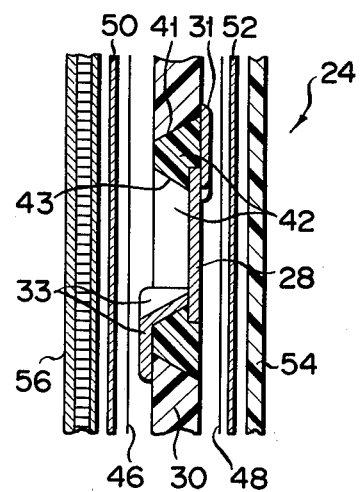
FIG. 3 is a sectional view of the semiconductor radiation sensor on line III—III of FIG. 2.

FIGS. 2 and 3 indicate in enlargement part of an X-ray detecting apparatus 24 according to one embodiment of this invention. FIG. 3 is a sectional view of said X-ray detecting apparatus 24 on line III—III of FIG. 2. The ring-shaped semiconductor radiation sensor 28 has an inner diameter of 25 mm and has its thickness of 300 microns to prevent its shadow from being impressed on an X-ray film. The semiconductor radiation sensor 28, as disclosed in the West German Offenlegungsschrift No. 2,806,858 is, formed of an N type high purity silicon single crystal, in which the impurity concentration is $\approx 2 \times 10^{12}$ cm$^{-3}$; the resistivity is $\approx 2.5$ k$\Omega$·cm; a hole life $\tau_p$ is $\approx 400$ microseconds; and a hole diffusion length $L_P$ is $\approx 0.72$ mm. Since the hole diffusion length $L_P$ is $\approx 0.72$, the semiconductor radiation sensor 28 can be operated without being impressed with voltage. The semiconductor radiation sensor 28 made thinner than the hole diffusion length $L_P$ is little likely to interact with radiation, and indicates an extremely small sensitivity decline even when damaged by radiation.

The semiconductor radiation sensor 28 is fixed to the surface of a ring-shaped mount 42 which is made from acrylic resin, for example, polymethyl methacrylate with an outer diameter of 40 mm and inner diameter of 25 mm. Both front and back sides of the semiconductor radiation sensor 28 are coated with an aluminum electrode layer (not shown). The mount 42 is securely engaged with a hole penetrating the substrate 30 made from, for example, the same polymethyl methacrylate or carbon fiber reinforced plastics (CFRP). Leads 31 and 33 connected to the electrodes of the semiconductor radiation sensor 28 extend along the substrate 30. The polymethyl methacrylate which little absorbs X-rays is favorably accepted.

The semiconductor radiation sensor 28 should preferably be made as thin as 100 to 800 microns of aluminum equivalent thickness in order to reduce its absorption of X-rays at anode voltage 50 to 150 kV of the X-ray tube 20 and prevent its shadow from being impressed on an X-ray film. For the same reason as given above, it is preferred that the leads 31 and 33 be formed of an aluminum layer having a smaller thickness than 80 microns. To ensure a uniform absorption of X-rays throughout the whole area of an X-ray detecting apparatus 24, the semiconductor radiation sensor 28, mount 42, substrate 30 and leads 31 and 33 are made from a specified material with a prescribed thickness.

As seen from FIG. 3, the outer portion 41 of the peripheral wall of the mount 42 (namely, that portion of the mount 42 which is engaged with the substrate 30), and the inner portion 43 of the peripheral wall of the mount 42 jointly define a tapered form. The mount 42 thus constructed suppresses the ununiform attenuation of X-rays in the boundary between the mount 42 and the substrate 30, and the boundary between the mount 42 and the semiconductor radiation sensor 28. Therefore, the shadows of the boundaries are prevented from being impressed on an X-ray film, thereby ensuring a distinct image.

Thin insulation layers 46 and 48 formed of, for example, mica are provided in parallel with both sides of the substrate 30. Further, electromagnetic shielding members 50 and 52 made of, for example, aluminum foil are respectively mounted on the insulation layers 46 and 48, thereby preventing an electric signal generated by the semiconductor radiation sensor 28 from being disturbed by noises.

A cover 54 made from, for example, polyester film is mounted on the aluminum foil 52 to protect the semiconductor radiation sensor 28 and also to render the X-ray detecting apparatus 24 attractive. A grid 56 which is made of, for example, lead (Pb) to eliminate scattered X-rays and has a thickness of 3 mm is mounted on the aluminum foil 50 provided on that side of the X-ray detecting apparatus 24 on which X-rays are introduced.

Depending on the application to which the grid 56 is put, proper selection is made of the material filled in a space defined between every two adjacent parallel arranged grid components (for example, aluminum or wood); the grid ratio (for example, 8:1 or 10:1); the number of the grid components (for example 34 lp/cm, or 40 lp/cm, wherein lp denotes a line pair); and a distance from the X-ray focus (for example, 80 cm or 100 cm).

The mechanically strong grid 56 is used as one of the components of the X-ray detecting apparatus 24, making it possible to use a thin substrate 30. The grid 56 concurrently acts as a protective member for the X-ray detecting apparatus 24, making it unnecessary to provide any protective layer such as the cover 54 on that side of the X-ray detecting apparatus 24 on which the grid 56 is set. Therefore, a typical configuration of X-ray detecting apparatus 24 can be chosen to have a thickness of about 6 mm, thereby reducing a distance between the object 22 and the X-ray film 26 and consequently the rate at which X-rays are geometrically magnified.

With the X-ray detecting apparatus 24 of this invention, the material of the substrate 30 can be selected over a wide range of mechanical strength, allowing for the easy design of the X-ray detecting apparatus 24.

Figure 4:
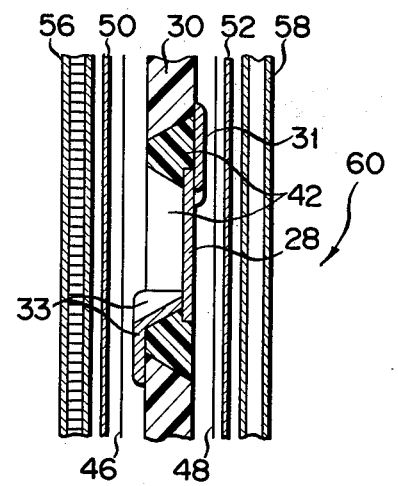
FIG. 4 is a sectional view of a semiconductor radiation sensor according to another embodiment of the invention.

Description is now given with reference to FIG. 4 of an X-ray detecting apparatus 60 according to another embodiment of this invention. For the effective elimination of scattered X-rays, two grids are generally provided between the object 22 and the X-ray film 26 (see FIG. 1), in such a manner that the parallel arranged components of one of the paired grids intersect those of the other grid at right angles. The paired grids are hereinafter referred to as "crosswise intersecting grids". In this case, two grids 56 and 58 (FIG. 4) are integrally assembled characteristically of this invention with the semiconductor radiation sensors 28 to constitute the X-ray detecting apparatus 60.

With the second embodiment of FIG. 4, the cover 54 of the X-ray detecting apparatus 24 of FIG. 2 is replaced by the second grid 58 crosswise intersecting the first grid 56. The crosswise intersecting grids 56 and 58 not only more effectively eliminate scattered X-rays but also make a distance between an object 22 and X-ray film 26 shorter than the conventional arrangement in which the two grids 56 and 58 and semiconductor radiation sensors 28 are separately provided.

The first and second grids 56 and 58 should preferably be positioned on both sides of the substrate 30 in crosswise intersecting relationship. However, it is possible to provide both crosswise intersecting grids 56 and 58 on one side of the substrate 30 in a mutually superposed state. In the latter case, it is advised to provide a cover on that side of the substrate 30 on which said grids 56 and 58 are not provided.

What we claim is:

1. A semiconductor radiation sensor arrangement for an automatic X-ray exposure control apparatus disposed between an object and an X-ray film to be exposed to X-rays which comprises:
   a substrate having a perforation therethrough;
   a mount bored with a tapering penetrating hole, and securely engaged in said perforation, the peripheral walls of said mount and said perforation having mating surfaces tapered in cross section in complementary form;
   a semiconductor radiation sensor fixed in said penetrating hole of said mount and having sufficient thinness to cause the X-rays to be attenuated to less than 800 microns of aluminum equivalent thickness, said sensor having electrodes;
   leads formed of an aluminum layer with a thinness of less than 80 microns and connected to said electrodes o said semiconductor radiation sensor; and
   means for providing both reinforcement for said semiconductor radiation sensor arrangement and scattered x-ray elimination, said means comprising at least one scattered X-ray eliminating grid disposed in parallel with said substrate and said semiconductor radiation sensor.

2. The semiconductor radiation sensor arrangement according to claim 1 having a pair of said grids and wherein said grids are provided on both sides of said substrate in a crosswise intersecting state.

3. The semiconductor radiation sensor arrangement according to claim 1 or 2, wherein said substrate is made from acrylic resin.

4. The semiconductor radiation sensor arrangement according to claim 1 or 2, which further comprises:
   an insulation layer provided to cover said substrate or said leads or both said substrate and said leads; and
   an electromagnetic shielding member made of a metal layer and mounted on said insulation layer.

5. The semiconductor radiation sensor arrangement according to claim 4, wherein the electromagnetic shielding member is made of aluminum.

6. The semiconductor radiation sensor arrangement according to claim 5, wherein said substrate is made from acrylic resin.

7. The semiconductor radiation sensor arrangement according to claim 4, wherein the insulation layer is made of mica.

8. The semiconductor radiation sensor arrangement according to claim 7, wherein said substrate is made from acrylic resin.

9. The semiconductor radiation sensor arrangement according to claim 4, wherein said substrate is made from acrylic resin.

* * * * *